United States Patent
Ozawa et al.

(10) Patent No.: US 8,513,990 B2
(45) Date of Patent: Aug. 20, 2013

(54) PLL FREQUENCY SYNTHESIZER

(75) Inventors: Seeichi Ozawa, Wako (JP); Shuhei Yamamoto, Tokyo (JP)

(73) Assignee: Thine Electronics, Inc., Tokyo (JP)

( * ) Notice: Subject to any disclaimer, the term of this patent is extended or adjusted under 35 U.S.C. 154(b) by 94 days.

(21) Appl. No.: 12/781,468

(22) Filed: May 17, 2010

(65) Prior Publication Data

US 2010/0295587 A1   Nov. 25, 2010

(30) Foreign Application Priority Data

May 19, 2009 (JP) ................................ 2009-121118

(51) Int. Cl.
  *H03L 7/06* (2006.01)
(52) U.S. Cl.
  USPC ............ 327/156; 327/146; 327/148; 327/157
(58) Field of Classification Search
  USPC ..................... 327/141, 144–163; 331/15–17; 375/373–376
  See application file for complete search history.

(56) References Cited

U.S. PATENT DOCUMENTS

| | | | |
|---|---|---|---|
| 2001/0028694 A1* | 10/2001 | Kushibe | 375/376 |
| 2002/0132598 A1 | 9/2002 | Saito | |
| 2002/0136341 A1* | 9/2002 | Huh et al. | 375/376 |
| 2003/0025538 A1* | 2/2003 | Bisanti et al. | 327/156 |
| 2004/0212440 A1* | 10/2004 | Dosho | 331/17 |
| 2007/0229173 A1* | 10/2007 | Kelkar et al. | 331/16 |
| 2009/0160565 A1* | 6/2009 | Kawamoto | 331/1 A |
| 2010/0183109 A1* | 7/2010 | Lin et al. | 375/376 |

FOREIGN PATENT DOCUMENTS

| | | |
|---|---|---|
| JP | 08-079064 A | 3/1996 |
| JP | 08-079067 A | 3/1996 |
| JP | 2002-280898 A | 9/2002 |
| JP | 2004-328456 A | 11/2004 |
| WO | 2005/093952 A1 | 6/2005 |
| WO | 2007/068088 A1 | 6/2007 |

OTHER PUBLICATIONS

Notice of Allowance dated issued on Feb. 26, 2013 issued in Japanese Patent Application No. 2009-121118.

* cited by examiner

*Primary Examiner* — Lincoln Donovan
*Assistant Examiner* — Brandon S Cole
(74) *Attorney, Agent, or Firm* — Sughrue Mion, PLLC

(57) ABSTRACT

In a PLL frequency synthesizer, a loop is constituted by a phase comparison unit, a gate unit, a charge pump, a capacitive element, a potential adjustment unit, a voltage-controlled oscillator, and a feedback division unit. In this loop, the gate unit and the charge pump are provided in parallel with the potential adjustment unit. A charging/discharging current is input from the charge pump to the capacitive element and the potential of a first end of the capacitive element is adjusted by the potential adjustment unit, so that a phase difference between a reference oscillation signal and a feedback oscillation signal input to the phase comparison unit is small.

6 Claims, 17 Drawing Sheets

PLL FREQUENCY SYNTHESIZER

BACKGROUND OF THE INVENTION

1. Field of the Invention

The present invention relates to a PLL frequency synthesizer.

2. Related Background Art

In general, a PLL frequency synthesizer includes a voltage-controlled oscillator, a phase comparison unit, a charge pump, and a loop filter, and outputs an oscillation signal having a frequency which is a constant multiple of a frequency of a reference oscillation signal.

The PLL frequency synthesizer operates as follows. A control voltage value is input to the voltage-controlled oscillator, and an oscillation signal having a frequency corresponding to the control voltage value is output from the voltage-controlled oscillator. The oscillation signal output from the voltage-controlled oscillator or a signal having a frequency obtained by dividing the frequency of the oscillation signal is input to the phase comparison unit as a feedback oscillation signal. Also, a reference oscillation signal is input to the phase comparison unit. The phase comparison unit detects a phase difference between the feedback oscillation signal and the reference oscillation signal. A phase difference signal indicating the detected phase difference is output. A charging/discharging current corresponding to the phase difference indicated by the phase difference signal is output from the charge pump receiving the phase difference signal. The charging/discharging current is input to the loop filter. A control voltage value output from the loop filter is input to the voltage-controlled oscillator. Thus, an oscillation signal having a frequency which is a constant multiple of a frequency of the reference oscillation signal is output from the PLL frequency synthesizer.

In general, the loop filter includes a resistor and a capacitive element. A first end of the resistor is connected to an output end of the charge pump, and is connected to an input end of the voltage-controlled oscillator. A second end of the resistor is connected to a reference potential via the capacitive element. Among time constants representing characteristics of the loop filter, a natural frequency $\omega_n$ is expressed by the following Equation (1), and a damping factor $\zeta$ is expressed by the following Equation (2). Here, Ipmp [A] is a magnitude of the charging/discharging current output from the charge pump, Kvco [Hz/V] is a gain of the voltage-controlled oscillator, C [F] is a capacitance value of the capacitive element, and R [Ω] is a resistance value of the resistor.

[Equation 1]

$$\omega_n = \sqrt{\frac{Ipmp \cdot Kvco}{C}} \quad (1)$$

[Equation 2]

$$\zeta = \frac{R}{2}\sqrt{Ipmp \cdot Kvco \cdot C} \quad (2)$$

An example of the above-described related art is disclosed in Japanese Unexamined Patent Application Publication No. 2002-280898.

SUMMARY OF THE INVENTION

In the PLL frequency synthesizer, it is preferable that a band of the loop filter should be narrow, that is, that the natural frequency $\omega_n$ of the loop filter should be low. To decrease the natural frequency $\omega_n$ of the loop filter, a decrease in the magnitude Ipmp of the charging/discharging current to be output from the charge pump or an increase in the capacitance value C of the capacitive element of the loop filter may be considered. However, the decrease in the magnitude Ipmp of the charging/discharging current to be output from the charge pump has a limit because of a problem of manufacturing accuracy. Consequently, from this viewpoint, it is desirable to increase the capacitance value C of the capacitive element of the loop filter. However, the increase in the capacitance value C leads to an increase in an area of the capacitive element and has a problem in that production cost may be increased. This problem is particularly prominent when the PLL frequency synthesizer is built in an LSI.

The present invention has been made to solve the above-described problem, and an object of the invention is to provide a PLL frequency synthesizer capable of decreasing a natural frequency $\omega_n$ of a loop filter while suppressing an increase in an area of a capacitive element of the loop filter.

According to the present invention, there is provided a PLL frequency synthesizer including: (1) a voltage-controlled oscillator which outputs an oscillation signal having a frequency corresponding to an input control voltage value; (2) a phase comparison unit which receives the oscillation signal output from the voltage-controlled oscillator or a signal having a frequency obtained by dividing the frequency of the oscillation signal as a feedback oscillation signal, receives a reference oscillation signal, detects a phase difference between the feedback oscillation signal and the reference oscillation signal, outputs a first phase difference signal when a phase of the feedback oscillation signal is behind that of the reference oscillation signal, and outputs a second phase difference signal when the phase of the feedback oscillation signal is ahead of that of the reference oscillation signal; (3) a gate unit which receives the first phase difference signal and the second phase difference signal output from the phase comparison unit and outputs the first phase difference signal and the second phase difference signal at a rate of M cycles (M is an integer equal to or greater than 1 or less than N) out of N cycles (N is an integer which is equal to or greater than 2) of the reference oscillation signal; (4) a charge pump which receives the first phase difference signal and the second phase difference signal output from the gate unit, and outputs a charging/discharging current corresponding to phase differences denoted by the signals; (5) a capacitive element which has a first end connected to an output end of the charge pump and a second end connected to a reference potential, is charged/discharged by inputting the charging/discharging current output from the charge pump to the first end, and outputs the control voltage value corresponding to a potential of the first end to the voltage-controlled oscillator; and (6) a potential adjustment unit which receives the first phase difference signal and the second phase difference signal output from the phase comparison unit, and increases or decreases the potential of the first end of the capacitive element in response to the phase differences denoted by the signals.

In the PLL frequency synthesizer, a loop is constituted by the phase comparison unit, the gate unit, the charge pump, the capacitive element, the potential adjustment unit, and the voltage-controlled oscillator. In this regard, in this loop, the gate unit and the charge pump are provided in parallel with the potential adjustment unit. The charging/discharging current is input from the charge pump to the capacitive element and the potential of the first end of the capacitive element is adjusted by the potential adjustment unit, so that a phase difference between the reference oscillation signal and the feedback oscillation signal input to the phase comparison unit is small. In a state in which the operation of the loop is stable, the oscillation signal output from the voltage-controlled oscillator has a frequency which is a constant multiple of a frequency of the reference oscillation signal.

According to the present invention, preferably, the PLL frequency synthesizer may further include a low-pass filter provided between the first end of the capacitive element and an input end of the voltage-controlled oscillator. In the PLL frequency synthesizer according to the present invention, preferably, the potential adjustment unit may include a first buffer which receives the first phase difference signal output from the phase comparison unit; a first capacitive element provided between an output end of the first buffer and the first end of the capacitive element; a second buffer which receives the second phase difference signal output from the phase comparison unit; and a second capacitive element provided between an output end of the second buffer and the first end of the capacitive element. At this time, preferably, the potential adjustment unit may include a first resistor provided between the output end of the first buffer and the first capacitive element; and a second resistor provided between the output end of the second buffer and the second capacitive element. Also, preferably, the potential adjustment unit may include an LDO power supply which drives each of the first buffer and the second buffer.

DESCRIPTION OF THE PREFERRED EMBODIMENTS

Figure 1:
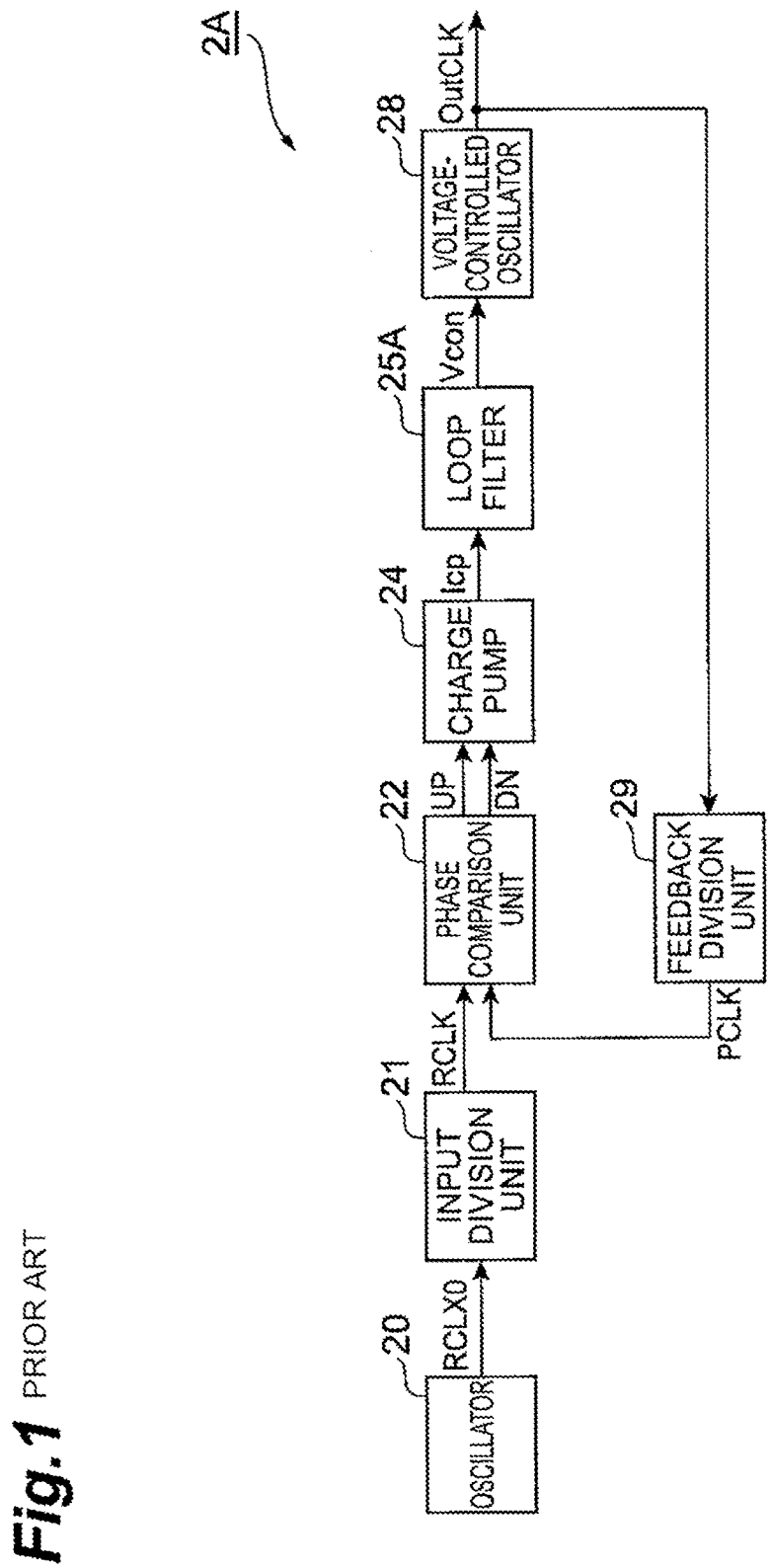
FIG. 1 is a diagram showing the configuration of a PLL frequency synthesizer 2A of a first comparative example.

Hereinafter, embodiments of the present invention will be described in detail with reference to the accompanying drawings. In description of the drawings, the same reference numeral is assigned to the same element, and redundant description is omitted. Hereinafter, the configurations of comparative examples are first described, and the configurations of the embodiments of the present invention are described while being compared with the comparative examples.

FIRST COMPARATIVE EXAMPLE

FIG. 1 shows the configuration of a PLL frequency synthesizer 2A of the first comparative example. The PLL frequency synthesizer 2A of the first comparative example shown in this figure includes an oscillator 20, an input division unit 21, a phase comparison unit 22, a charge pump 24, a loop filter 25A, a voltage-controlled oscillator 28, and a feedback division unit 29.

For example, the oscillator 20 includes a crystal oscillator, and outputs an oscillation signal RCLK0 of a fixed frequency stabilized with high accuracy to the input division unit 21. The input division unit 21 receives the oscillation signal RCLK0 output from the oscillator 20, generates a reference oscillation signal RCLK by dividing the oscillation signal RCLK0, and outputs the reference oscillation signal RCLK to the phase comparison unit 22.

The phase comparison unit 22 receives the reference oscillation signal RCLK output from the input division unit 21, and receives a feedback oscillation signal PCLK output from the feedback division unit 29. The phase comparison unit 22 detects a phase difference between the feedback oscillation signal PCLK and the reference oscillation signal RCLK. When the phase of the feedback oscillation signal PCLK is behind the phase of the reference oscillation signal RCLK, the phase comparison unit 22 outputs a first phase difference signal UP as a pulse to the charge pump 24. When the phase of the feedback oscillation signal PCLK is ahead of the phase of the reference oscillation signal RCLK, the phase comparison unit 22 outputs a second phase difference signal DN as a pulse to the charge pump 24.

The charge pump 24 receives the first phase difference signal UP and the second phase difference signal DN output from the phase comparison unit 22. The charge pump 24 outputs a charging/discharging current Icp corresponding to phase differences denoted by the signals UP and DN to the loop filter 25A. The loop filter 25A receives the charging/discharging current Icp output from the charge pump 24, and outputs a control voltage value Vcon increased/decreased in response to the charging/discharging current Icp to the voltage-controlled oscillator 28.

The voltage-controlled oscillator 28 receives the control voltage value Vcon output from the loop filter 25A and outputs an oscillation signal OutCLK having a frequency corresponding to the control voltage value Vcon. The feedback division unit 29 receives the oscillation signal OutCLK output from the voltage-controlled oscillator 28, generates the feedback oscillation signal PCLK by dividing the oscillation signal OutCLK, and outputs the feedback oscillation signal PCLK to the phase comparison unit 22.

In the PLL frequency synthesizer 2A, a loop is constituted by the phase comparison unit 22, the charge pump 24, the loop filter 25A, the voltage-controlled oscillator 28, and the feedback division unit 29.

In the loop, the charging/discharging current Icp is input from the charge pump 24 to the loop filter 25A so that a phase difference between the reference oscillation signal RCLK and the feedback oscillation signal PCLK input to the phase comparison unit 22 is small. Then, in a state in which the operation of the loop is stable, the oscillation signal OutCLK output from the voltage-controlled oscillator 28 has a frequency which is a constant multiple of a frequency of the reference oscillation signal RCLK.

Figure 2:
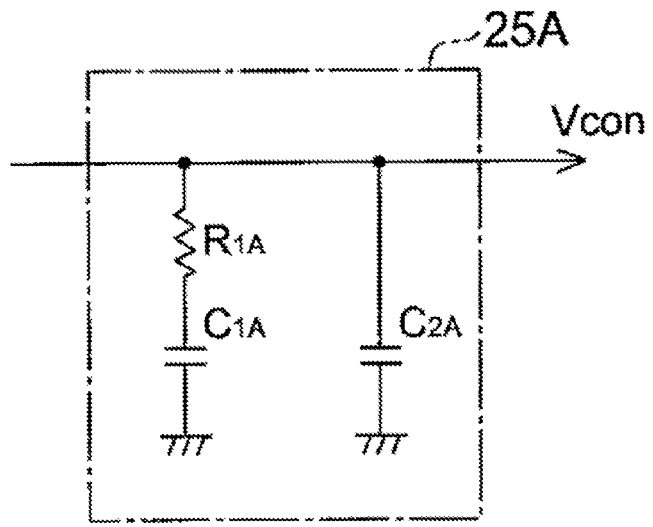
FIG. 2 is a circuit diagram of a loop filter 25A included in the PLL frequency synthesizer 2A of the first comparative example.

FIG. 2 is a circuit diagram of the loop filter 25A included in the PLL frequency synthesizer 2A of the first comparative example. In the first comparative example, the loop filter 25A includes a resistor $R_{1A}$, a capacitive element $C_{1A}$, and a capacitive element $C_{2A}$. One end of the resistor $R_{1A}$ is connected to an output end of the charge pump 24 and an input end of the voltage-controlled oscillator 28, and the other end of the resistor $R_{1A}$ is connected to a ground potential via the capacitive element $C_{1A}$. One end of the capacitive element $C_{2A}$ is connected to the output end of the charge pump 24 and the input end of the voltage-controlled oscillator 28, and the other end of the capacitive element $C_{2A}$ is connected to the ground potential.

The charging/discharging current Icp output from the charge pump 24 and input to the loop filter 25A flows into the capacitive element $C_{1A}$ via the resistor $R_{1A}$, and changes an accumulated charge amount in the capacitive element $C_{1A}$. The control voltage value Vcon output from the loop filter 25A and input to the voltage-controlled oscillator 28 includes a voltage value corresponding to the accumulated charge amount in the capacitive element $C_{1A}$ and a voltage drop in the resistor $R_{1A}$ due to a current which flows through the resistor $R_{1A}$.

Figure 3:
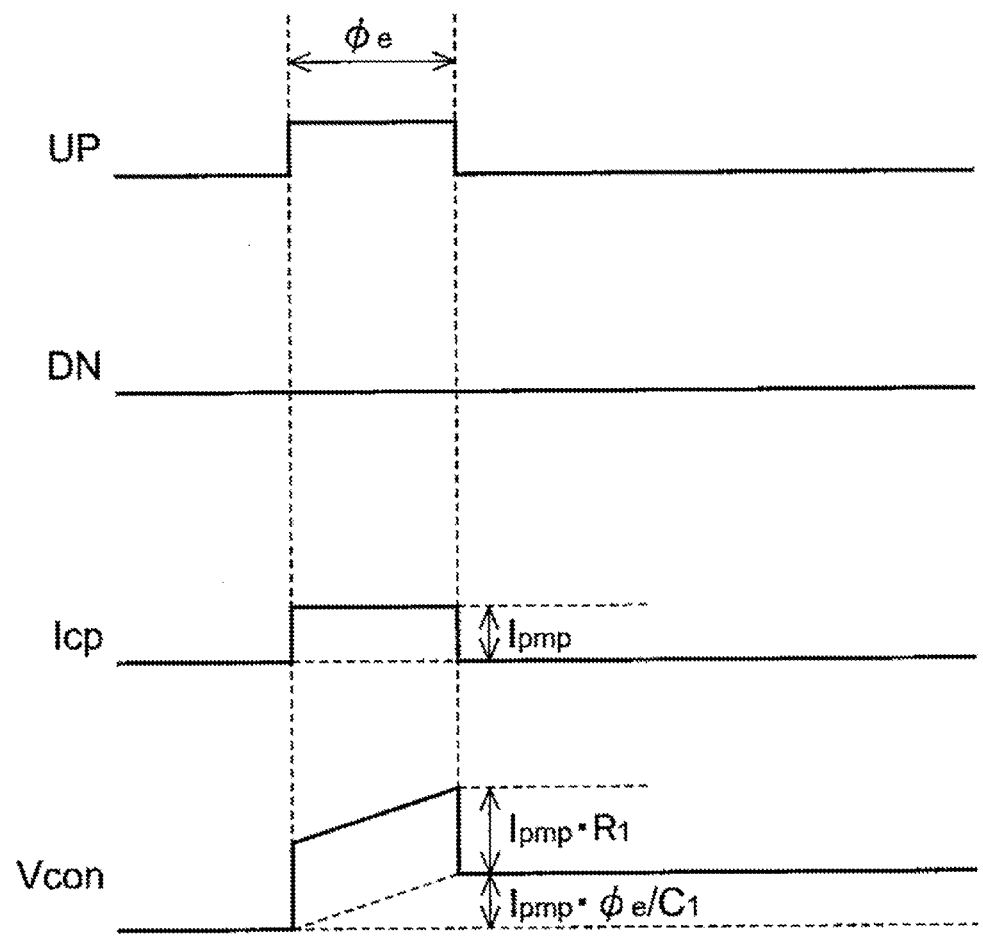
FIG. 3 is an example of waveforms of a first phase difference signal UP, a second phase difference signal DN, a charging/discharging current Icp, and a control voltage value Vcon in the PLL frequency synthesizer 2A of the first comparative example.

FIG. 3 is an example of waveforms of the first phase difference signal UP, the second phase difference signal DN, the charging/discharging current Icp, and the control voltage value Vcon in the PLL frequency synthesizer 2A of the first comparative example. Here, the phase of the feedback oscillation signal PCLK is behind the phase of the reference oscillation signal RCLK, and the first phase difference signal UP output from the phase comparison unit 22 is input to the charge pump 24 as a pulse. In this figure, the waveform when the loop filter 25A does not include the capacitive element $C_{2A}$ is shown, but the control voltage value Vcon has a dull waveform when the loop filter 25A includes the capacitive element $C_{2A}$.

As shown in this figure, the pulse of the first phase difference signal UP output from the phase comparison unit 22 has a pulse width φe corresponding to a phase difference of the feedback oscillation signal PCLK from the reference oscillation signal RCLK. A value of the charging/discharging current Icp output from the charge pump 24 and input to the loop filter 25A becomes a current value Ipmp over a pulse period of the first phase difference signal UP.

A resistance value of the resistor $R_{1A}$ included in the loop filter 25A is set as $R_1$ and a capacitance value of the capacitive element $C_{1A}$ included in the loop filter 25A is set as $C_1$. In a pulse period of the first phase difference signal UP, the control voltage value Vcon output from the loop filter 25A and input to the voltage-controlled oscillator 28 includes a voltage value corresponding to the accumulated charge amount in the capacitive element $C_{1A}$ and a voltage drop (Ipmp·$R_1$) in the resistor $R_{1A}$ due to a current which flows through the resistor $R_{1A}$. After the pulse period of the first phase difference signal UP, the control voltage value Vcon becomes a voltage value (Ipmp·φe/$C_1$) corresponding to the accumulated charge amount in the capacitive element $C_{1A}$.

In the PLL frequency synthesizer 2A of the first comparative example as described above, a decrease in the magnitude Ipmp of the charging/discharging current to be output from the charge pump 24 or an increase in the capacitance value of the capacitive element $C_{1A}$ of the loop filter 25A may be considered to narrow a band of the loop filter 25A (that is, to decrease the natural frequency $\omega_n$ of the loop filter 25A) as described above. However, the decrease in the magnitude Ipmp of the charging/discharging current to be output from the charge pump 24 has a limit because of a problem of manufacturing accuracy. On the other hand, the increase in the capacitance value of the capacitive element $C_{1A}$ leads to an increase in an area of the capacitive element $C_{1A}$ and has a problem in that production cost may be increased. As a configuration for solving this problem, the configuration of the second comparative example shown in FIG. 4 may be considered.

SECOND COMPARATIVE EXAMPLE

Figure 4:
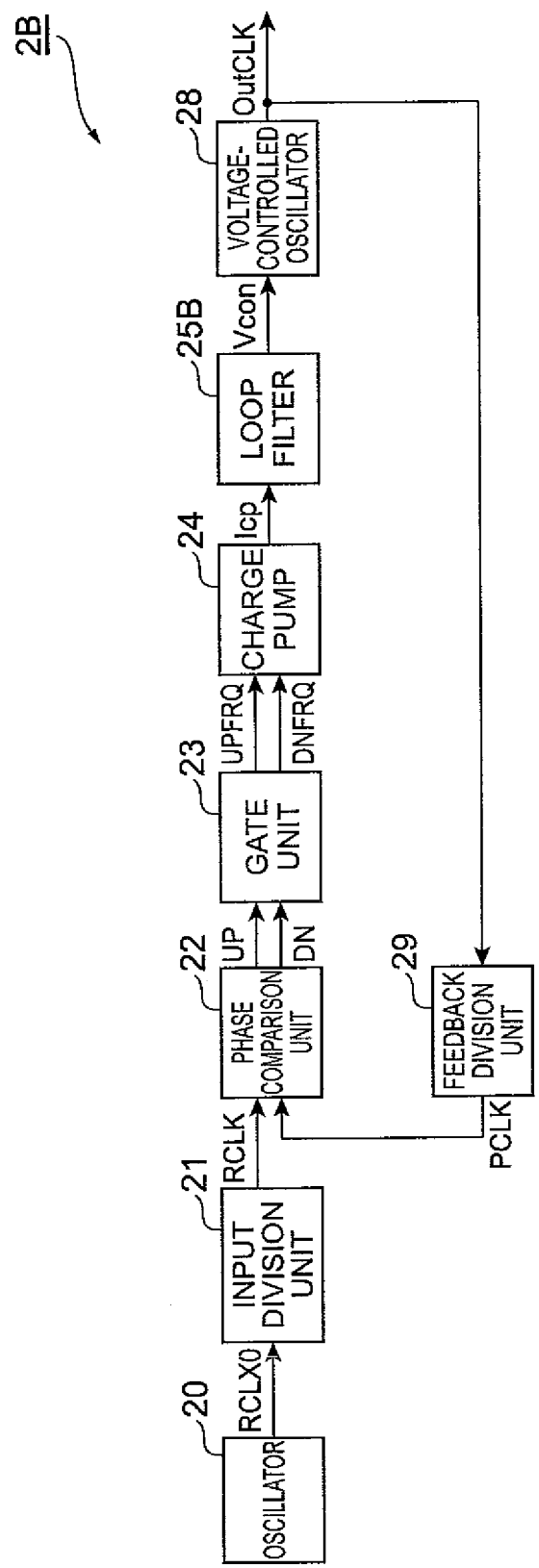
FIG. 4 is a diagram showing the configuration of a PLL frequency synthesizer 2B of a second comparative example.

FIG. 4 is a diagram showing the configuration of a PLL frequency synthesizer 2B of the second comparative example. The PLL frequency synthesizer 2B of the second comparative example shown in this figure includes an oscillator 20, an input division unit 21, a phase comparison unit 22, a gate unit 23, a charge pump 24, a loop filter 25B, a voltage-controlled oscillator 28, and a feedback division unit 29.

As compared to the configuration of the PLL frequency synthesizer 2A of the first comparative example shown in FIG. 1, the PLL frequency synthesizer 2B of the second comparative example shown in FIG. 4 is different in that the gate unit 23 is further included and the loop filter 25B is included instead of the loop filter 25A.

The gate unit 23 receives a first phase difference signal UP and a second phase difference signal DN output from the phase comparison unit 22. The gate unit 23 outputs the first phase difference signal UP and the second phase difference signal DN at a rate of M cycles (M is an integer equal to or greater than 1 or less than N) out of N cycles (N is an integer which is equal to or greater than 2) of a reference oscillation signal RCLK. Hereinafter, the first phase difference signal output from the gate unit 23 at the rate of M cycles out of N cycles is denoted by UPFRQ, and the second phase difference signal output from the gate unit 23 at the rate of M cycles out of N cycles is denoted by DNFRQ. The gate unit 23 outputs the first phase difference signal UPFRQ and the second phase difference signal DNFRQ to the charge pump 24. Hereinafter, it is assumed that M=1.

The charge pump 24 receives the first phase difference signal UPFRQ and the second phase difference signal DNFRQ from the gate unit 23. The charge pump 24 outputs a charging/discharging current Icp corresponding to phase differences denoted by the signals UPFRQ and DNFRQ to the loop filter 25B. The loop filter 25B receives the charging/discharging current Icp output from the charge pump 24, and outputs a control voltage value Vcon increased/decreased in response to the charging/discharging current Icp to the voltage-controlled oscillator 28.

Figure 5:
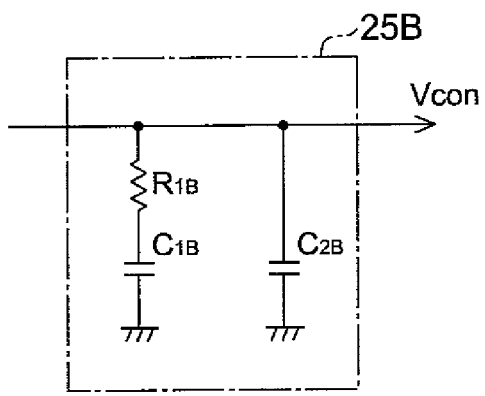
FIG. 5 is a circuit diagram of a loop filter 25B included in the PLL frequency synthesizer 2B of the second comparative example.

FIG. 5 is a circuit diagram of the loop filter 25B included in the PLL frequency synthesizer 2B of the second comparative example. In the second comparative example, the loop filter 25B includes a resistor $R_{1B}$, a capacitive element $C_{1B}$, and a capacitive element $C_{2B}$. One end of the resistor $R_{1B}$ is connected to an output end of the charge pump 24 and an input end of the voltage-controlled oscillator 28, and the other end of the resistor $R_{1B}$ is connected to a ground potential via the capacitive element $C_{1B}$. One end of the capacitive element $C_{2B}$ is connected to the output end of the charge pump 24 and the input end of the voltage-controlled oscillator 28, and the other end of the capacitive element $C_{2B}$ is connected to the ground potential.

As compared to the configuration of the loop filter 25A in the first comparative example shown in FIG. 2, the loop filter 25B in the second comparative example shown in FIG. 5 is different in a resistance value of the resistor and capacitance values of the capacitive elements. That is, when the resistance value of the resistor $R_{1A}$ is set as $R_1$, the capacitance value of the capacitive element $C_{1A}$ is set as $C_1$, and the capacitance value of the capacitive element $C_{2A}$ is set as $C_2$ in the first comparative example, the resistance value of the resistor $R_{1B}$ is set as $R_1 \cdot N$, the capacitance value of the capacitive element $C_{1B}$ is set as $C_1/N$, and the capacitance value of the capacitive element $C_{2B}$ is set as $C_2/N$ in the second comparative example.

The PLL frequency synthesizer 2B of the second comparative example as described above includes the gate unit 23 provided between the phase comparison unit 22 and the charge pump 24, thereby decreasing a natural frequency $\omega_n$ of the loop filter 25B while suppressing an increase in an area of the capacitive element $C_{1B}$ of the loop filter 25B. However, since the gate unit 23 provided in the PLL frequency synthesizer 2B of the second comparative example becomes a delay element of $0.5 \cdot N \cdot T\_RCLK$ on average, the operation of the PLL frequency synthesizer 2B may be unstable. T_RCLK is a cycle of the reference oscillation signal RCLK. As a configuration for solving this problem, the configuration of a first embodiment shown in FIG. 6 may be considered.

First Embodiment

Figure 6:
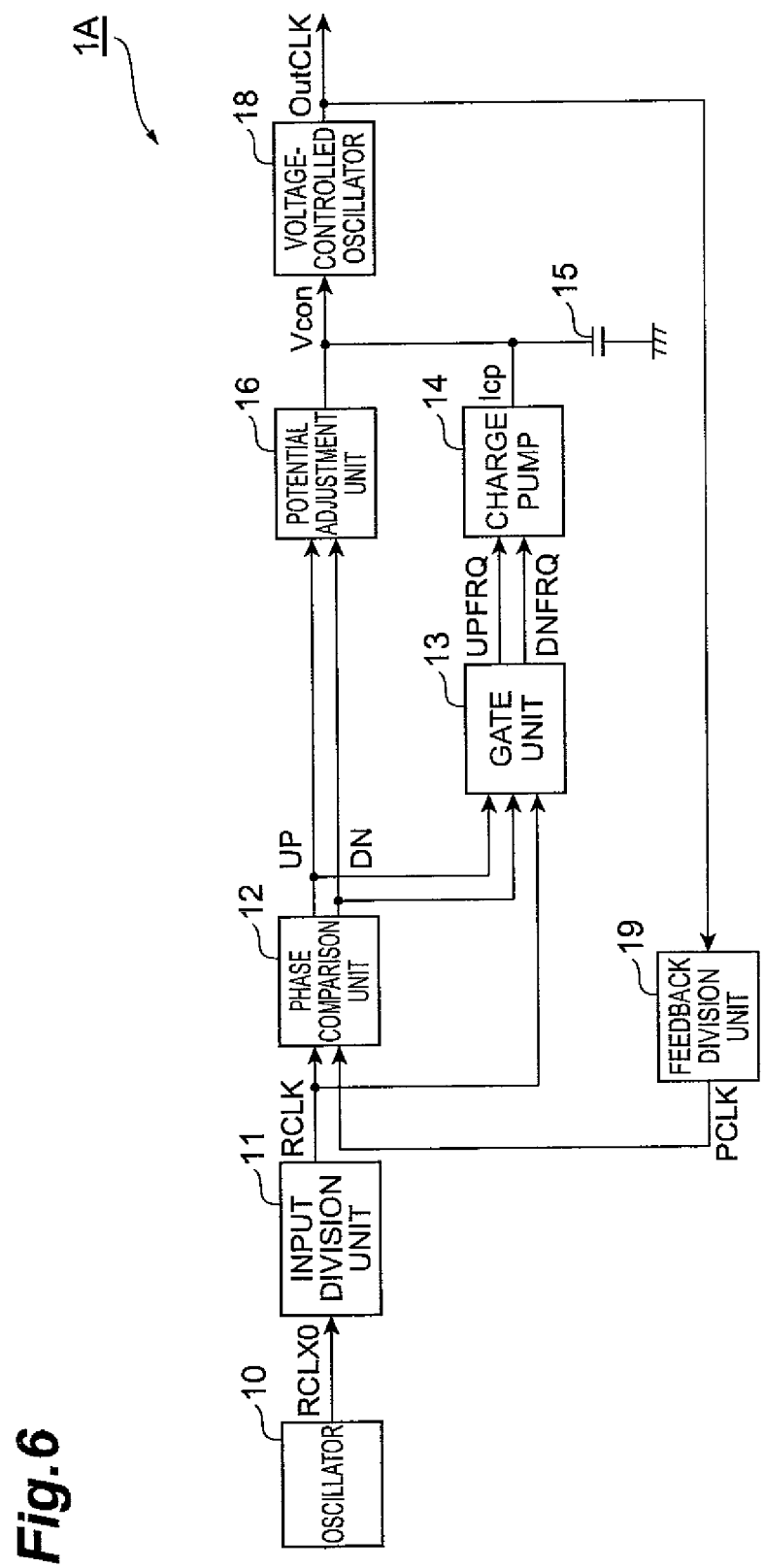
FIG. 6 is a diagram showing the configuration of a PLL frequency synthesizer 1A of a first embodiment.

FIG. 6 is a diagram showing the configuration of a PLL frequency synthesizer 1A of the first embodiment. The PLL frequency synthesizer 1A shown in this figure includes an oscillator 10, an input division unit 11, a phase comparison unit 12, a gate unit 13, a charge pump 14, a capacitive element 15, a potential adjustment unit 16, a voltage-controlled oscillator 18, and a feedback division unit 19.

For example, the oscillator 10 includes a crystal oscillator, and outputs an oscillation signal RCLK0 of a fixed frequency stabilized with high accuracy to the input division unit 11. The input division unit 11 receives the oscillation signal RCLK0 output from the oscillator 10, generates a reference oscillation signal RCLK by dividing the oscillation signal RCLK0, and outputs the reference oscillation signal RCLK to the phase comparison unit 12.

The phase comparison unit 12 receives the reference oscillation signal RCLK output from the input division unit 11, and receives a feedback oscillation signal PCLK output from the feedback division unit 19. The phase comparison unit 12 detects a phase difference between the feedback oscillation signal PCLK and the reference oscillation signal RCLK. When the phase of the feedback oscillation signal PCLK is behind the phase of the reference oscillation signal RCLK, the phase comparison unit 12 outputs a first phase difference signal UP as a pulse to each of the gate unit 13 and the potential adjustment unit 16. When the phase of the feedback oscillation signal PCLK is ahead of the phase of the reference oscillation signal RCLK, the phase comparison unit 12 outputs a second phase difference signal DN as a pulse to each of the gate unit 13 and the potential adjustment unit 16.

The gate unit 13 receives the first phase difference signal UP and the second phase difference signal DN output from the phase comparison unit 12. The gate unit 13 outputs the first phase difference signal UP and the second phase difference signal DN at a rate of M cycles (M is an integer equal to or greater than 1 or less than N) out of N cycles (N is an integer which is equal to or greater than 2) of the reference oscillation signal RCLK. Hereinafter, the first phase difference signal output from the gate unit 13 at the rate of M cycles out of N cycles is denoted by UPFRQ, and the second phase difference signal output from the gate unit 13 at the rate of M cycles out of N cycles is denoted by DNFRQ. The gate unit 13 outputs the first phase difference signal UPFRQ and the second phase difference signal DNFRQ to the charge pump 14. Hereinafter, it is assumed that M=1.

The charge pump 14 receives the first phase difference signal UPFRQ and the second phase difference signal DNFRQ from the gate unit 13. The charge pump 14 outputs a charging/discharging current Icp corresponding to phase differences denoted by the signals UPFRQ and DNFRQ to the capacitive element 15.

The capacitive element 15 has a first end connected to an output end of the charge pump 14 and a second end connected to a ground potential. The capacitive element 15 is charged/discharged by inputting the charging/discharging current Icp output from the charge pump 14 to the first end. A control voltage value Vcon corresponding to a potential of the first end is output to the voltage-controlled oscillator 18. A capacitance value of the capacitive element 15 is substantially the same as that of the capacitive element $C_{1B}$ of the loop filter 25B in the second comparative example.

The potential adjustment unit 16 receives the first phase difference signal UP and the second phase difference signal DN output from the phase comparison unit 12. The potential adjustment unit 16 increases or decreases the potential of the first end of the capacitive element 15 in response to phase differences denoted by the signals UP and DN.

The voltage-controlled oscillator 18 receives the control voltage value Vcon output from the first end of the capacitive element 15 and outputs an oscillation signal OutCLK having a frequency corresponding to the control voltage value Vcon. The feedback division unit 19 receives the oscillation signal OutCLK output from the voltage-controlled oscillator 18, generates the feedback oscillation signal PCLK by dividing the oscillation signal OutCLK, and outputs the feedback oscillation signal PCLK to the phase comparison unit 12.

In the PLL frequency synthesizer 1A, a loop is constituted by the phase comparison unit 12, the gate unit 13, the charge pump 14, the capacitive element 15, the potential adjustment unit 16, the voltage-controlled oscillator 18, and the feedback division unit 19. In this regard, in this loop, the gate unit 13 and the charge pump 14 are provided in parallel with the potential adjustment unit 16. In this loop, the charging/discharging current Icp is input from the charge pump 14 to the capacitive element 15 and the potential of the first end of the capacitive element 15 is adjusted by the potential adjustment unit 16, so that a phase difference between the reference oscillation signal RCLK and the feedback oscillation signal PCLK input to the phase comparison unit 12 is small. Then, in a state in which the operation of the loop is stable, the oscillation signal OutCLK output from the voltage-controlled oscillator 18 has a frequency which is a constant multiple of a frequency of the reference oscillation signal RCLK.

Figure 7:
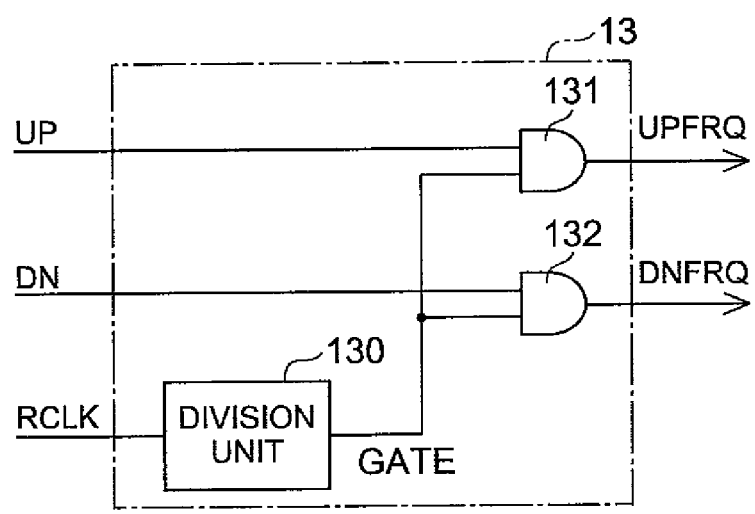
FIG. 7 is a circuit diagram of a gate unit 13 included in the PLL frequency synthesizer 1A of the first embodiment.

FIG. 7 is a circuit diagram of the gate unit 13 included in the PLL frequency synthesizer 1A of the first embodiment. The gate unit 13 includes a division unit 130, a logic AND circuit 131, and a logic AND circuit 132. The division unit 130 receives the reference oscillation signal RCLK, and outputs a high-level gate signal GATE at a rate of 1 cycle out of N cycles of the reference oscillation signal RCLK. At a timing when the reference oscillation signal RCLK is shifted from a high level to a low level, the gate signal GATE is shifted from the low level to the high level. Next, at a timing when the reference oscillation signal RCLK is shifted from the high level to the low level, the gate signal GATE is shifted from the high level to the low level.

The logic AND circuit 131 receives the first phase difference signal UP output from the phase comparison unit 12, and also receives the gate signal GATE output from the division unit 130. The logic AND circuit 131 performs a logical AND operation on the first phase difference signal UP and the gate signal GATE, and outputs the first phase difference signal UPFRQ as the operation result.

The logic AND circuit 132 receives the second phase difference signal DN output from the phase comparison unit 12, and also receives the gate signal GATE output from the division unit 130. The logic AND circuit 132 performs a logical AND operation on the second phase difference signal DN and the gate signal GATE, and outputs the second phase difference signal DNFRQ as the operation result. The gate unit 13 constituted as described above is able to output the first phase difference signal UPFRQ and the second phase difference signal DNFRQ at the rate of 1 cycle out of N cycles of the reference oscillation signal RCLK.

Figure 8:
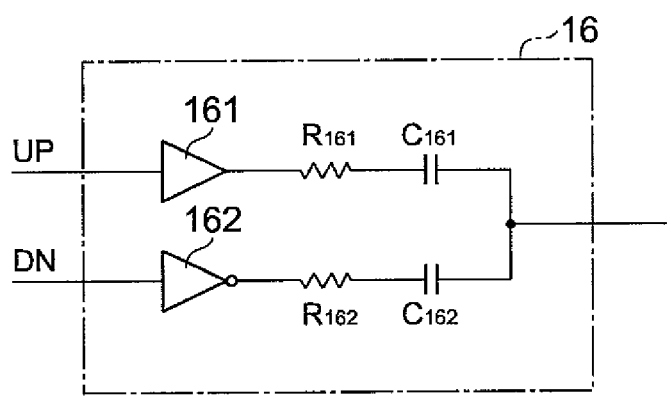
FIG. 8 is a circuit diagram of a potential adjustment unit 16 included in the PLL frequency synthesizer 1A of the first embodiment.

FIG. 8 is a circuit diagram of the potential adjustment unit 16 included in the PLL frequency synthesizer 1A of the first embodiment. The potential adjustment unit 16 includes a first buffer 161, a second buffer 162, a first resistor $R_{161}$, a second resistor $R_{162}$, a first capacitive element $C_{161}$, and a second capacitive element $C_{162}$. The first resistor $R_{161}$ and the second resistor $R_{162}$ have the same resistance value as each other. The first capacitive element $C_{161}$ and the second capacitive element $C_{162}$ have the same capacitance value as each other. For example, the first capacitive element $C_{161}$ and the second capacitive element $C_{162}$ may be respectively implemented as a metal capacitor.

The first buffer 161 receives the first phase difference signal UP. The second buffer 162 receives the second phase difference signal DN. One end of the first resistor $R_{161}$ is connected to an output end of the first buffer 161, and the other end of the first resistor $R_{161}$ is connected to the capacitive element 15 via the first capacitive element $C_{161}$. One end of the second resistor $R_{162}$ is connected to an output end of the second buffer 162, and the other end of the second resistor $R_{162}$ is connected to the capacitive element 15 via the second capacitive element $C_{162}$.

The potential adjustment unit 16 constituted as described above is able to increase or decrease the potential of the first end of the capacitive element 15 in response to phase differences denoted by the first phase difference signal UP and the second phase difference signal DN output from the phase comparison unit 12.

Figure 9:
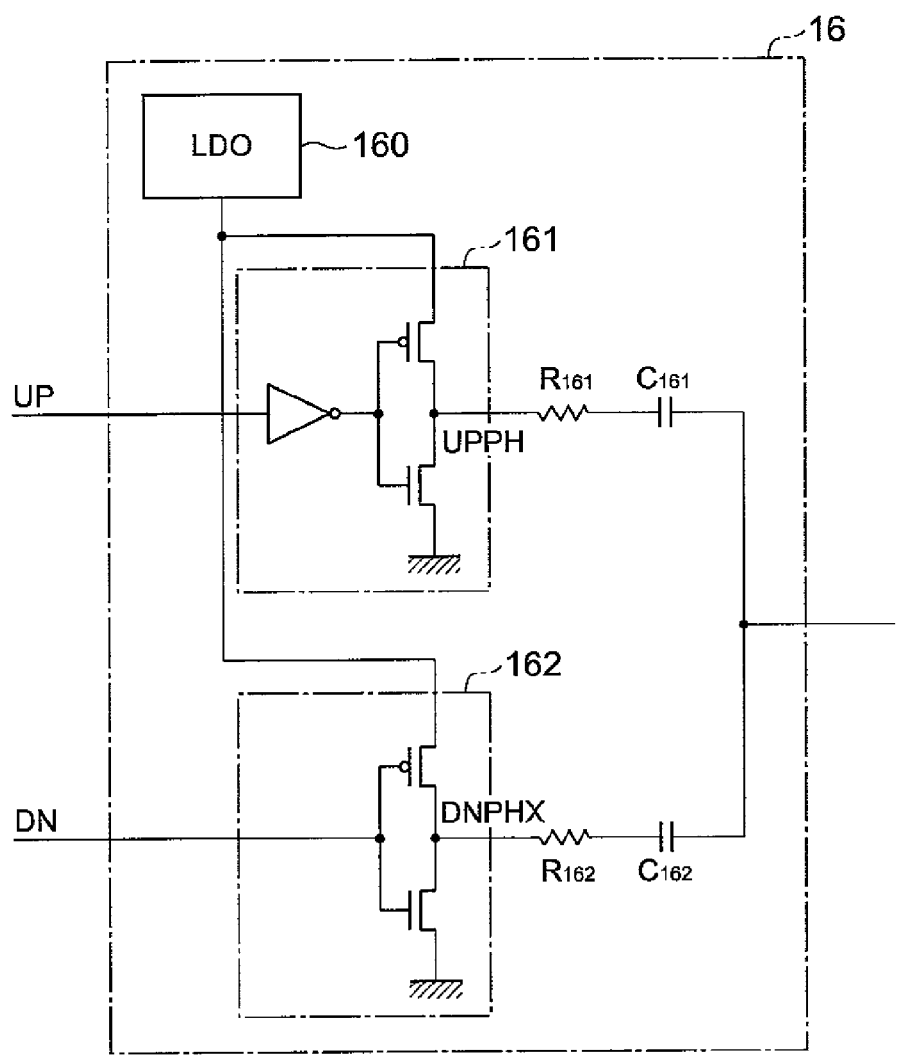
FIG. 9 is a detailed circuit diagram of the potential adjustment unit 16 included in the PLL frequency synthesizer 1A of the first embodiment.

FIG. 9 is a detailed circuit diagram of the potential adjustment unit 16 included in the PLL frequency synthesizer 1A of the first embodiment. In this figure, each of the first buffer 161 and the second buffer 162 is shown in a circuit diagram of a transistor level. In this figure, an LDO (Low Drop Out) power supply 160 which drives each of the first buffer 161 and the second buffer 162 is also shown.

A change of a power supply voltage which drives each of the first buffer 161 and the second buffer 162 becomes the cause of jitter in the potential adjustment of the first end of the capacitive element 15 by the potential adjustment unit 16. It is desirable to use the LDO power supply 160 capable of supplying a stable voltage value as a power supply which drives each of the first buffer 161 and the second buffer 162.

The first resistor $R_{161}$ and the second resistor $R_{162}$ may not be provided in the potential adjustment unit 16. However, since the first buffer 161 directly drives the first capacitive element $C_{161}$ when the first resistor $R_{161}$ is not provided, an instant large current flows, and therefore there is a possibility that it may be the cause of the degradation of reliability. The same is true even when the second resistor $R_{162}$ is not provided. The reliability is improved by providing the first resistor $R_{161}$ and the second resistor $R_{162}$. By providing the first resistor $R_{161}$ and the second resistor $R_{162}$, the potential adjustment unit 16 also has a function of a low-pass filter, and this point is also advantageous.

Figure 10:
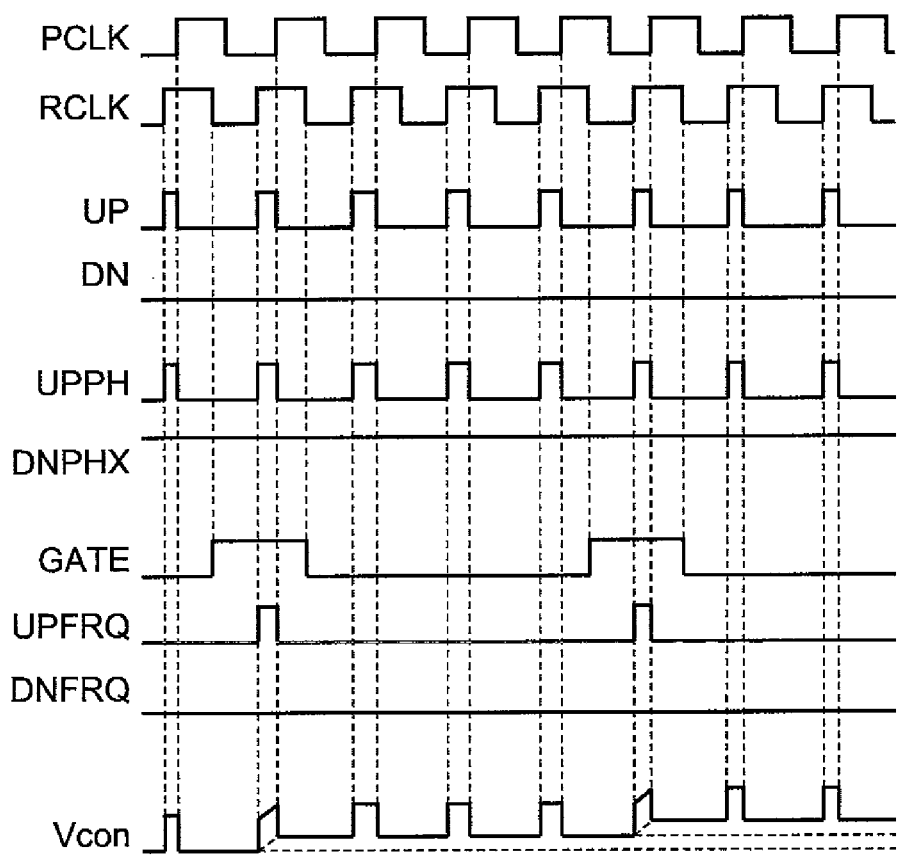
FIG. 10 is a diagram showing an example of waveforms of signals in the PLL frequency synthesizer 1A of the first embodiment.
Figure 11:
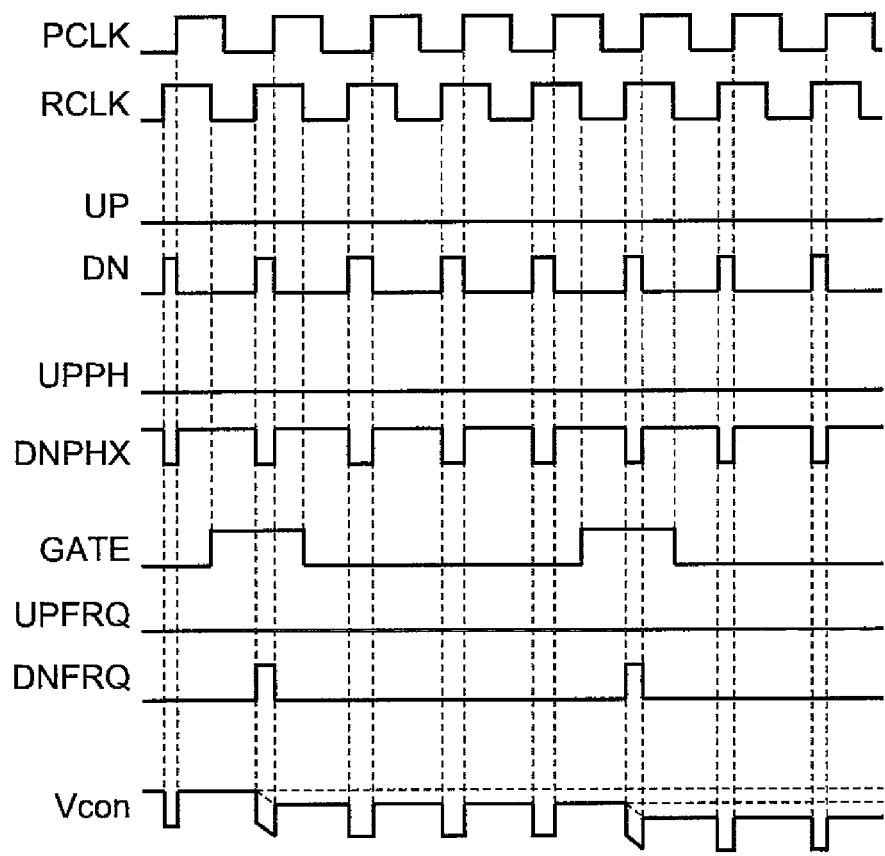
FIG. 11 is a diagram showing another example of waveforms of signals in the PLL frequency synthesizer 1A of the first embodiment.

FIGS. 10 and 11 are diagrams showing examples of signal waveforms in the PLL frequency synthesizer 1A of the first embodiment. In order from the top, these figures show waveform examples of a feedback oscillation signal PCLK input to the phase comparison unit 12, a reference oscillation signal RCLK input to the phase comparison unit 12, a first phase difference signal UP output from the phase comparison unit 12, a second difference signal DN output from the phase comparison unit 12, an output signal UPPH from the first buffer 161 of the potential adjustment unit 16, an output signal DNPHX from the second buffer 162 of the potential adjustment unit 16, a gate signal GATE output from the division unit 130 of the gate unit 13, a first phase difference signal UPFRQ output from the gate unit 13, a second phase difference signal DNFRQ output from the gate unit 13, and a control voltage value Vcon input to the voltage-controlled oscillator 18.

In the example shown in FIG. 10, the phase of the feedback oscillation signal PCLK is set to be behind the phase of the reference oscillation signal RCLK and the first phase difference signal UP as a pulse is set to be output from the phase comparison unit 12. Also, the N value is set as 4. That is, the pulse of the first phase difference signal UP output from the phase comparison unit 12 appears in each cycle of the reference oscillation signal RCLK, while the pulse of the first phase difference signal UPFRQ output from the gate unit 13 appears at a rate of 1 cycle out of 4 cycles of the reference oscillation signal RCLK.

Consequently, in a period when the first phase difference signal UP from the phase comparison unit 12 is output as a pulse in each cycle of the reference oscillation signal RCLK, the control voltage value Vcon input to the voltage-controlled oscillator 18 is adjusted by the potential adjustment unit 16. Also, in a period when the first phase difference signal UPFRQ from the gate unit 13 is output as a pulse at the rate of 1 cycle out of 4 cycles of the reference oscillation signal RCLK, the capacitive element 15 is charged and thereafter the control voltage value Vcon is maintained as a value after charging.

In the example shown in FIG. 11, the phase of the feedback oscillation signal PCLK is set to be ahead of the phase of the reference oscillation signal RCLK and the second phase difference signal DN as a pulse is set to be output from the phase comparison unit 12. Also, the N value is set as 4. That is, the pulse of the second phase difference signal DN output from the phase comparison unit 12 appears in each cycle of the reference oscillation signal RCLK, while the pulse of the second phase difference signal DNFRQ output from the gate unit 13 appears at the rate of 1 cycle out of 4 cycles of the reference oscillation signal RCLK.

Consequently, in a period when the second phase difference signal DN from the phase comparison unit 12 is output as a pulse in each cycle of the reference oscillation signal RCLK, the control voltage value Vcon input to the voltage-controlled oscillator 18 is adjusted by the potential adjustment unit 16. Also, in a period when the second phase difference signal DNFRQ from the gate unit 13 is output as a pulse at the rate of 1 cycle out of 4 cycles of the reference oscillation signal RCLK, the capacitive element 15 is discharged and thereafter the control voltage value Vcon is maintained as a value after discharging.

Here, in the first embodiment, a capacitance value of the capacitive element 15 is set as $C_{15}$, a capacitance value of each of the first capacitive element $C_{161}$ and the second capacitive element $C_{162}$ included in the potential adjustment unit 16 is set as $C_{16}$, and a pulse magnitude of each of the output signals UPPH and DNPHX of the first buffer 161 and the second buffer 162 included in the potential adjustment unit 16 is set as Vphfb. As shown in FIGS. 9, 10, and 11, the pulses of the signals UPPH and DNPHX have polarities opposite to each other. In the first comparative example, a resistance value of the resistor $R_{1A}$ included in the loop filter 25A is set as $R_1$, and a magnitude of the charging/discharging current Icp output from the charge pump 24 is set as Ipmp. At this time, when a relational expression of $Vphfb \cdot C_{16}/C_{15} = R_1 \cdot Ipmp$ is satisfied, the first embodiment and the first comparative example may have the same effect regarding adjustment of the phase of the oscillation signal OutCLK output from the voltage-controlled oscillator 18.

Figure 12A:
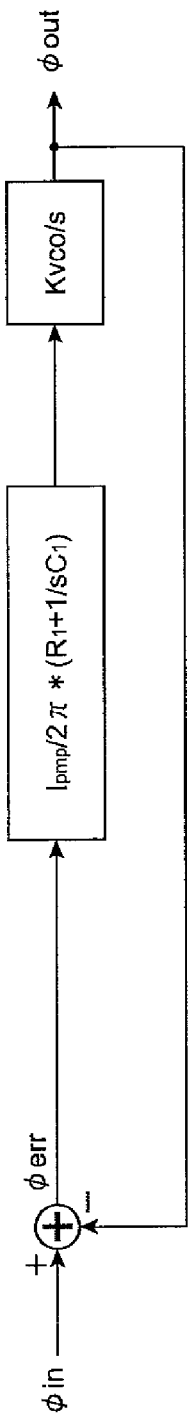
FIGS. 12A to 12C are diagrams showing transfer function models in PLL frequency synthesizers of the first comparative example, the second comparative example, and the first embodiment.
Figure 12B:
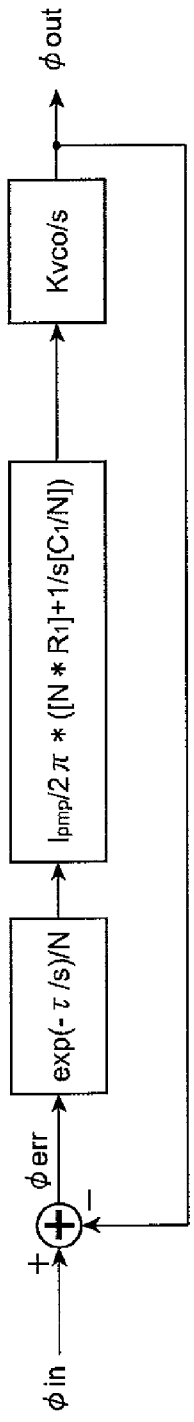
Figure 12C:
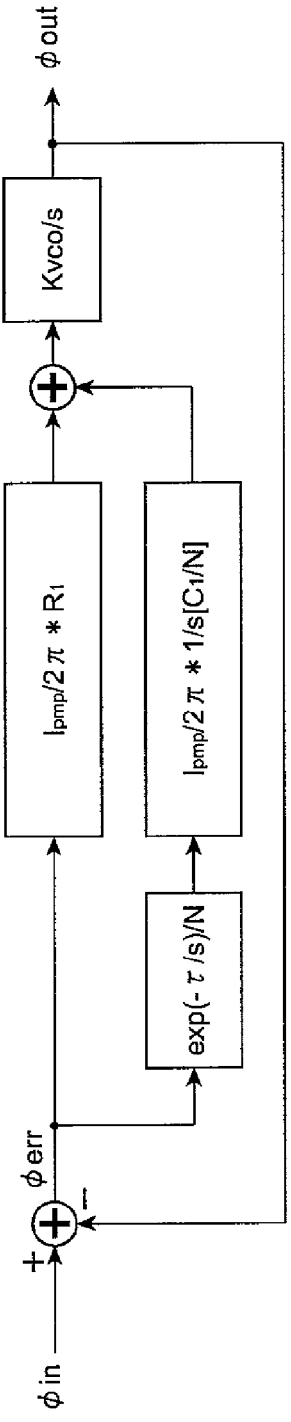

FIGS. 12A to 12C are diagrams showing transfer function models in the PLL frequency synthesizers of the first comparative example, the second comparative example, and the first embodiment. FIG. 12A shows the transfer function model of the PLL frequency synthesizer 2A of the first comparative example, FIG. 12B shows the transfer function model of the PLL frequency synthesizer 2B of the second comparative example, and FIG. 12C shows the transfer function model of the PLL frequency synthesizer 1A of the first embodiment. In each of the transfer function models of FIGS. 12B and 12C, τ denotes a delay time by the gate unit 13 or 23 as a delay element, and is expressed by an expression of τ=0.5·N·T_RCLK. T_RCLK is a cycle of the reference oscillation signal RCLK.

In the transfer function model of the PLL frequency synthesizer 2B of the second comparative example shown in FIG. 12B, a phase shift by the gate unit 13 as the delay element exists within the loop. Consequently, the operation of the PLL frequency synthesizer 2B of the second comparative example becomes unstable. On the other hand, in the transfer function model of the PLL frequency synthesizer 1A shown in FIG. 12C, a restrictive phase shift by the gate unit 13 as the delay element exists for an integral term of a proportional term and the integral term provided in parallel with each other within the loop. Therefore, the operation of the PLL frequency synthesizer 1A of the first embodiment is stable.

Figure 13:
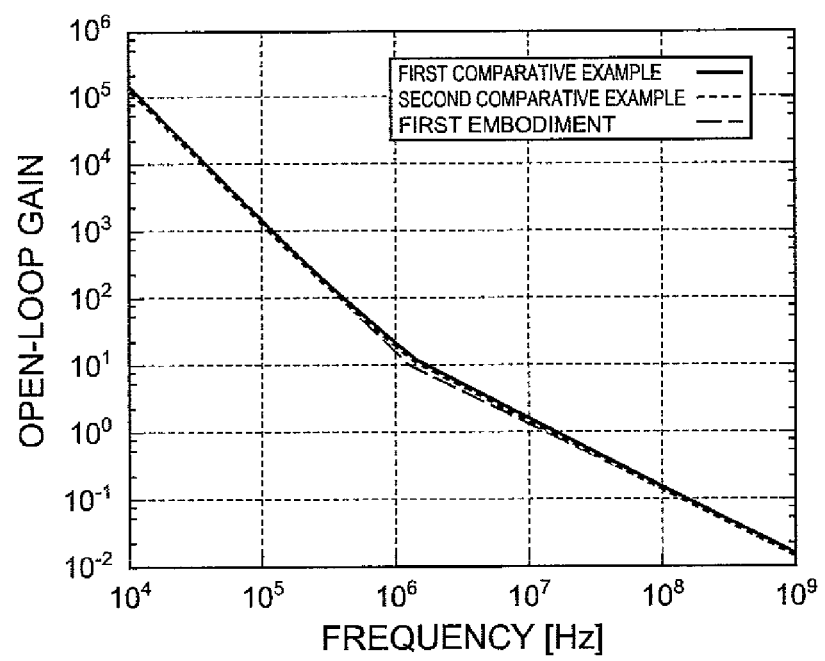
FIG. 13 is a graph showing the frequency dependency of an open-loop gain of each PLL frequency synthesizer of the first comparative example, the second comparative example, and the first embodiment.
Figure 14:
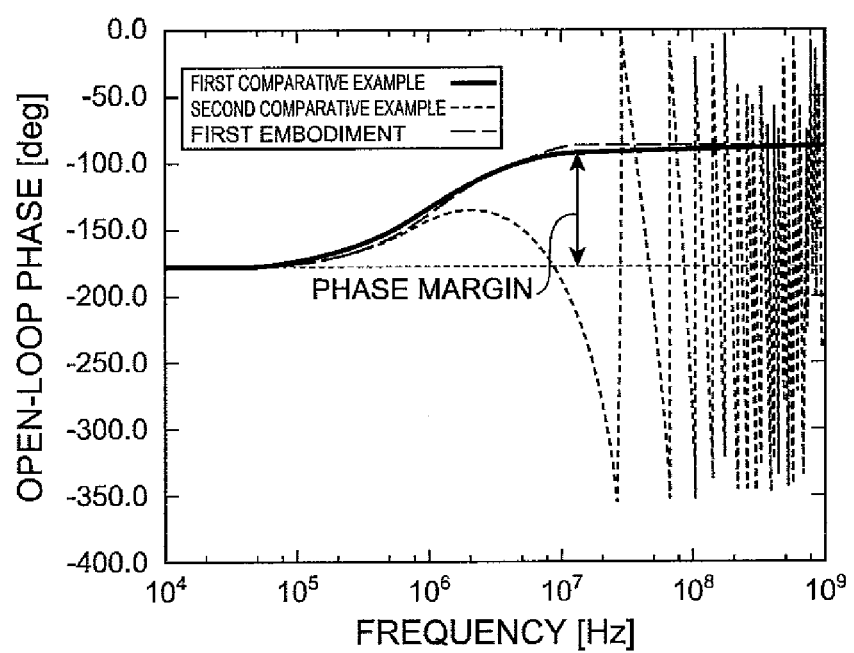
FIG. 14 is a graph showing the frequency dependency of an open-loop phase of each PLL frequency synthesizer of the first comparative example, the second comparative example, and the first embodiment.
Figure 15:
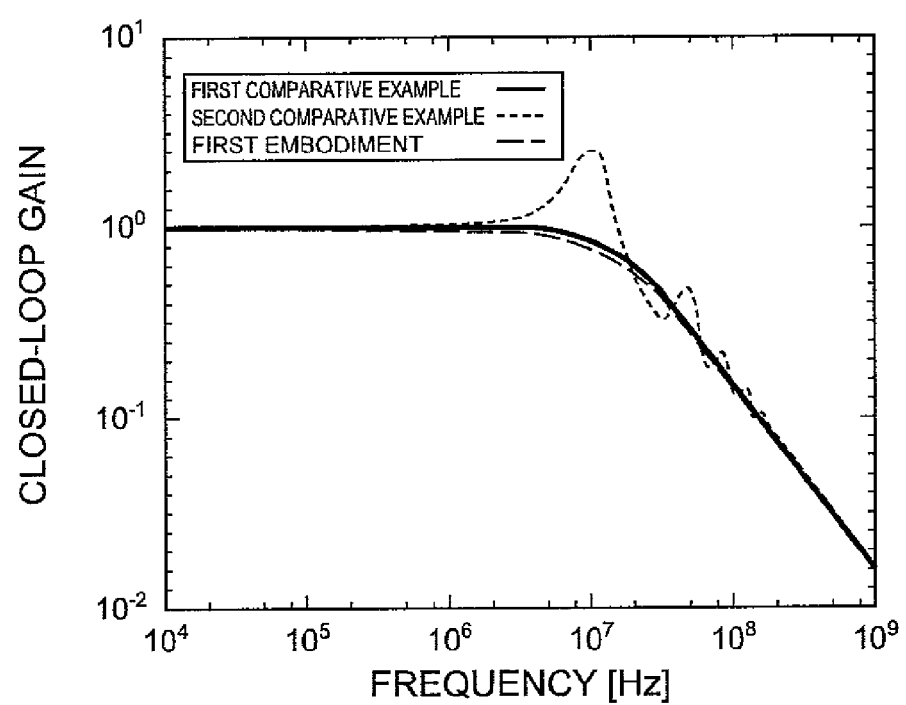
FIG. 15 is a graph showing the frequency dependency of a closed-loop gain of each PLL frequency synthesizer of the first comparative example, the second comparative example, and the first embodiment.

FIG. 13 is a graph showing the frequency dependency of an open-loop gain of each PLL frequency synthesizer of the first comparative example, the second comparative example, and the first embodiment. FIG. 14 is a graph showing the frequency dependency of an open-loop phase of each PLL frequency synthesizer of the first comparative example, the second comparative example, and the first embodiment. FIG. 15 is a graph showing the frequency dependency of a closed-loop gain of each PLL frequency synthesizer of the first comparative example, the second comparative example, and the first embodiment. These are calculated on the basis of the transfer function models shown in FIGS. 12A to 12C.

As shown in FIG. 13, a difference among the PLL frequency synthesizers of the first comparative example, the second comparative example, and the first embodiment rarely exists in terms of the frequency dependency of the open-loop gain.

As shown in FIG. 14, since the phase is rotated around a crossover frequency at which the open-loop gain is 1 due to the effect of a phase shift by the gate unit 23 as the delay element in the PLL frequency synthesizer 2B of the second comparative example in terms of the frequency dependency of the open-loop phase, no phase margin exists. On the other hand, it is possible to secure the phase margin in the PLL frequency synthesizer 1A of the first embodiment like the PLL frequency synthesizer 2A of the first comparative example.

As a result, an unstable peak appears in the PLL frequency synthesizer 2B of the second comparative example in terms of the frequency dependency of the closed-loop gain as shown in FIG. 15. On the other hand, stable characteristics are shown in the PLL frequency synthesizer 1A of the first embodiment like the PLL frequency synthesizer 2A of the first comparative example.

As described above, the PLL frequency synthesizer 1A of the first embodiment is able to decrease a natural frequency $\omega_n$ and perform a stable operation while suppressing an increase in an area of the capacitive element 15.

Second Embodiment

Figure 16:
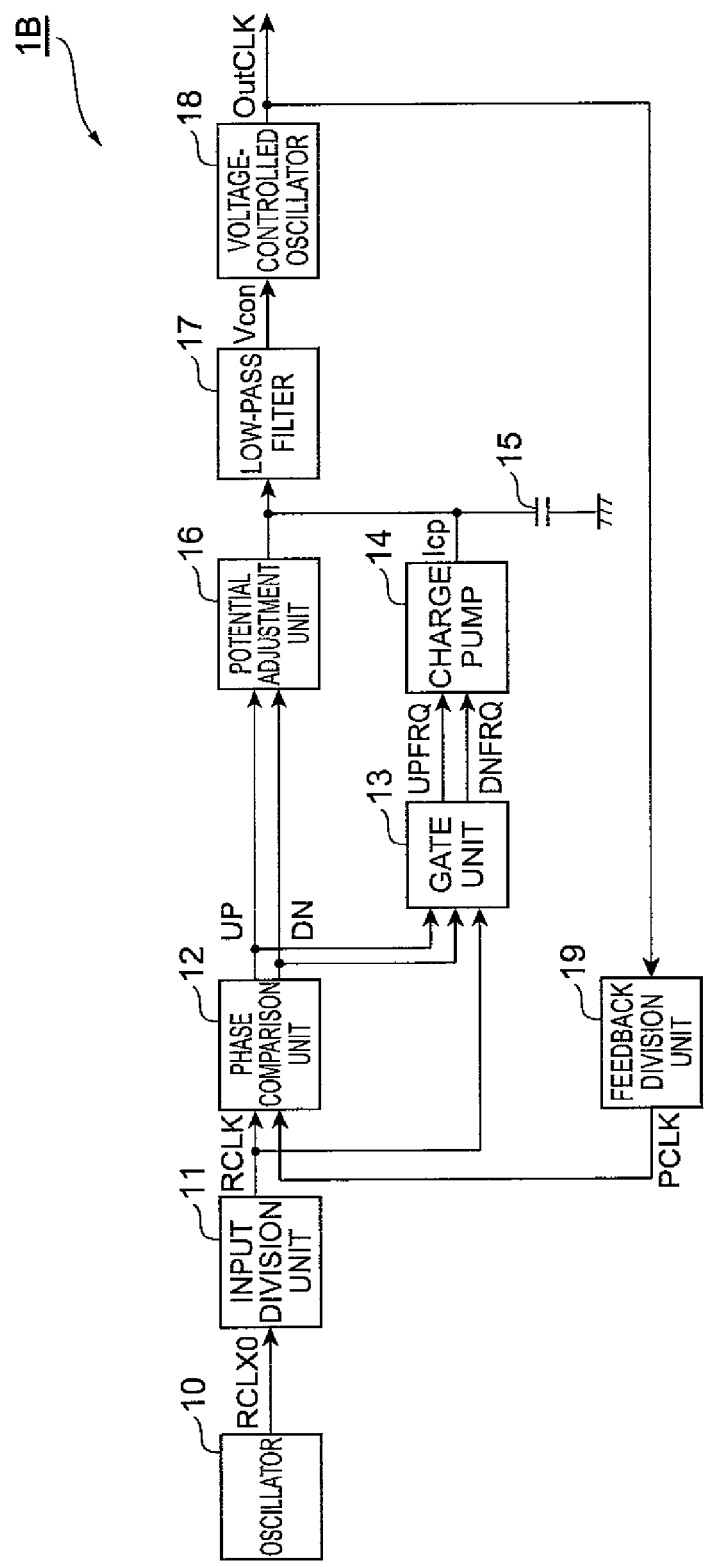
FIG. 16 is a diagram showing the configuration of a PLL frequency synthesizer 1B of a second embodiment.

FIG. 16 is a diagram showing the configuration of a PLL frequency synthesizer 1B of the second embodiment. The PLL frequency synthesizer 1B shown in this figure includes an oscillator 10, an input division unit 11, a phase comparison unit 12, a gate unit 13, a charge pump 14, a capacitive element 15, a potential adjustment unit 16, a low-pass filter 17, a voltage-controlled oscillator 18, and a feedback division unit 19.

As compared to the configuration of the PLL frequency synthesizer 1A of the first embodiment shown in FIG. 6, the PLL frequency synthesizer 1B of the second embodiment shown in FIG. 16 is different in that the low-pass filter 17 is further included between a first end of the capacitive element 15 and an input end of the voltage-controlled oscillator 18.

Figure 17:
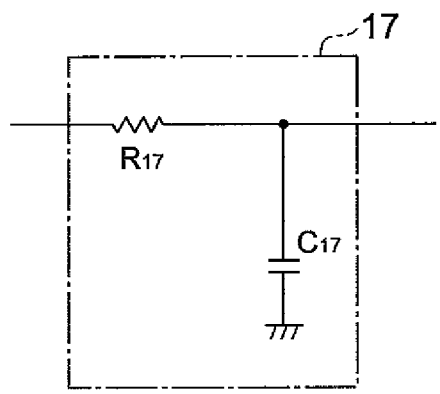
FIG. 17 is a circuit diagram of a low-pass filter 17 included in the PLL frequency synthesizer 1B of the second embodiment.

FIG. 17 is a circuit diagram of the low-pass filter 17 included in the PLL frequency synthesizer 1B of the second embodiment. The low-pass filter 17 includes a resistor $R_{17}$ and a capacitive element $C_{17}$. One end of the resistor $R_{17}$ is connected to the first end of the capacitive element 15. The other end of the resistor $R_{17}$ is connected to the input end of the voltage-controlled oscillator 18, and is connected to a ground potential via the capacitive element $C_{17}$. In the low-pass filter 17, the configuration shown in FIG. 17 may be constituted in multiple stages.

MODIFIED EXAMPLE

The present invention is not limited to the above-described embodiments, and various modifications may be made. For example, the gate unit 13 and the potential adjustment unit 16 are not limited to the above-described circuit configurations, and may have other circuit configurations. The input division unit 11 may be not provided and the feedback division unit 19 may also be not provided.

As described above, the PLL frequency synthesizer according to the present invention is able to decrease a natural frequency $\omega_n$ of a loop filter while suppressing an increase in an area of a capacitive element of the loop filter.

What is claimed is:

1. A PLL frequency synthesizer comprising:
a voltage-controlled oscillator which outputs an oscillation signal having a frequency corresponding to an input control voltage value;
a phase comparison unit which receives the oscillation signal output from the voltage-controlled oscillator or a signal having a frequency obtained by dividing the frequency of the oscillation signal as a feedback oscillation signal, receives a reference oscillation signal, detects a phase difference between the feedback oscillation signal and the reference oscillation signal, outputs a first phase difference signal when a phase of the feedback oscillation signal is behind that of the reference oscillation signal, and outputs a second phase difference signal when the phase of the feedback oscillation signal is ahead of that of the reference oscillation signal;
a gate unit which receives the first phase difference signal and the second phase difference signal output from the phase comparison unit and outputs the first phase difference signal and the second phase difference signal at cycles of M cycles (M is an integer equal to or greater than 1 and less than N) out of N cycles (N is an integer which is equal to or greater than 2) of the reference oscillation signal;
a charge pump which receives the first phase difference signal and the second phase difference signal output from the gate unit, and outputs a charging/discharging current corresponding to phase differences denoted by the signals;
a first capacitive element which has a first end connected to an output end of the charge pump and a second end connected to a reference potential, is charged/discharged by inputting the charging/discharging current output from the charge pump to the first end, and outputs the control voltage value corresponding to a potential of the first end to the voltage-controlled oscillator; and
a potential adjustment unit which receives the first phase difference signal and the second phase difference signal output from the phase comparison unit, and increases or decreases the potential of the first end of the first capacitive element in response to the phase differences denoted by the signals,
wherein the potential adjustment unit comprises:
a second capacitive element connected to the first end of the first capacitive element; and
a third capacitive element connected to the first end of the first capacitive element.

2. The PLL frequency synthesizer according to claim 1, further comprising:
a low-pass filter provided between the first end of the first capacitive element and an input end of the voltage-controlled oscillator.

3. A PLL frequency synthesizer comprising:
a voltage-controlled oscillator which outputs an oscillation signal having a frequency corresponding to an input control voltage value;
a phase comparison unit which receives the oscillation signal output from the voltage-controlled oscillator or a signal having a frequency obtained by dividing the frequency of the oscillation signal as a feedback oscillation signal, receives a reference oscillation signal, detects a phase difference between the feedback oscillation signal and the reference oscillation signal, outputs a first phase difference signal when a phase of the feedback oscillation signal is behind that of the reference oscillation signal, and outputs a second phase difference signal when the phase of the feedback oscillation signal is ahead of that of the reference oscillation signal;
a gate unit which receives the first phase difference signal and the second phase difference signal output from the phase comparison unit and outputs the first phase difference signal and the second phase difference signal at cycles of M cycles (M is an integer equal to or greater than 1 and less than N) out of N cycles (N is an integer which is equal to or greater than 2) of the reference oscillation signal;
a charge pump which receives the first phase difference signal and the second phase difference signal output from the gate unit, and outputs a charging/discharging current corresponding to phase differences denoted by the signals;
a first capacitive element which has a first end connected to an output end of the charge pump and a second end connected to a reference potential, is charged/discharged by inputting the charging/discharging current output from the charge pump to the first end, and outputs the control voltage value corresponding to a potential of the first end to the voltage-controlled oscillator; and
a potential adjustment unit which receives the first phase difference signal and the second phase difference signal output from the phase comparison unit, and increases or decreases the potential of the first end of the first capacitive element in response to the phase differences denoted by the signals,
wherein the potential adjustment unit includes:
a first buffer which receives the first phase difference signal output from the phase comparison unit;
a second capacitive element provided between an output end of the first buffer and the first end of the first capacitive element;
a second buffer which receives the second phase difference signal output from the phase comparison unit; and
a third capacitive element provided between an output end of the second buffer and the first end of the first capacitive element.

4. The PLL frequency synthesizer according to claim 3, wherein the potential adjustment unit includes:
a first resistor provided between the output end of the first buffer and the second capacitive element; and
a second resistor provided between the output end of the second buffer and the third capacitive element.

5. The PLL frequency synthesizer according to claim 3, wherein the potential adjustment unit includes:

an LDO power supply which drives each of the first buffer and the second buffer.

6. A PLL frequency synthesizer comprising:

a voltage-controlled oscillator which outputs an oscillation signal having a frequency corresponding to an input control voltage value;

a phase comparison unit which receives the oscillation signal output from the voltage-controlled oscillator or a signal having a frequency obtained by dividing the frequency of the oscillation signal as a feedback oscillation signal, receives a reference oscillation signal, detects a phase difference between the feedback oscillation signal and the reference oscillation signal, outputs a first phase difference signal when a phase of the feedback oscillation signal is behind that of the reference oscillation signal, and outputs a second phase difference signal when the phase of the feedback oscillation signal is ahead of that of the reference oscillation signal;

a gate unit which receives the first phase difference signal and the second phase difference signal output from the phase comparison unit and outputs the first phase difference signal and the second phase difference signal at cycles of M cycles (M is an integer equal to or greater than 1 and less than N) out of N cycles (N is an integer which is equal to or greater than 2) of the reference oscillation signal;

a charge pump which receives the first phase difference signal and the second phase difference signal output from the gate unit, and outputs a charging/discharging current corresponding to phase differences denoted by the signals;

a first capacitive element which has a first end connected to an output end of the charge pump and a second end connected to a reference potential, is charged/discharged by inputting the charging/discharging current output from the charge pump to the first end, and outputs the control voltage value corresponding to a potential of the first end to the voltage-controlled oscillator; and a potential adjustment unit which receives the first phase difference signal and the second phase difference signal output from the phase comparison unit, and increases or decreases the potential of the first end of the first capacitive element in response to the phase differences denoted by the signals, wherein the potential adjustment unit comprises:

a second capacitive element connected to the first end of the first capacitive element.

\* \* \* \* \*